(12) United States Patent
Chen et al.

(10) Patent No.: US 11,532,603 B2
(45) Date of Patent: Dec. 20, 2022

(54) DISPLAY PANEL AND HEAD MOUNTED DEVICE

(71) Applicant: PlayNitride Display Co., Ltd., Miaoli County (TW)

(72) Inventors: Yi-Ching Chen, Miaoli County (TW); Pei-Hsin Chen, Miaoli County (TW); Yi-Chun Shih, Miaoli County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 29 days.

(21) Appl. No.: 17/123,146

(22) Filed: Dec. 16, 2020

(65) Prior Publication Data

US 2021/0398953 A1 Dec. 23, 2021

(30) Foreign Application Priority Data

Jun. 19, 2020 (TW) ................................. 109120682

(51) Int. Cl.
*H01L 25/075* (2006.01)
*H01L 23/00* (2006.01)
*H01L 33/62* (2010.01)

(52) U.S. Cl.
CPC .......... *H01L 25/0753* (2013.01); *H01L 24/16* (2013.01); *H01L 24/17* (2013.01);
(Continued)

(58) Field of Classification Search
CPC ... H01L 27/1214–1296; H01L 27/3244–3279; H01L 27/1218; H01L 27/162–1266; H01L 27/3251–3253; H01L 27/153–16; H01L 27/32–3293; H01L 27/3234; H01L 27/15–156; H01L 27/1296; H01L 27/326–3265; H01L 21/02428–0243; H01L 23/12–15; H01L 51/0096–0097; H01L 51/0097; H01L 51/50–56; H01L 51/0032–0095; H01L 2251/5338; H01L 2251/50–568; H01L 25/0753; H01L 2224/16221;
(Continued)

(56) References Cited

U.S. PATENT DOCUMENTS

2007/0030676 A1* 2/2007 Ichihara .................... F21K 9/00 257/E33.059
2019/0383474 A1* 12/2019 Vasylyev ............... F21V 17/007
(Continued)

*Primary Examiner* — Lawrence C Tynes, Jr.
(74) *Attorney, Agent, or Firm* — JCIPRNET

(57) ABSTRACT

The present invention discloses a display panel and a head mounted device. The display panel includes a substrate and a plurality of micro light emitting units. A first position and a second position are defined at an edge and a center of the substrate respectively. The micro light emitting units are arranged and disposed on the substrate. Any two of the micro light emitting units are disposed at the first position and the second position respectively. Wherein each micro light emitting unit defines a luminating top surface, and a reference angle is defined between each luminating top surface and a reference plane respectively. Wherein the reference angle defined between each luminating top surface and the reference plane gradually decreases from the first position to the second position, and the luminating top surface of the micro light emitting unit located at the second position is parallel to the reference surface.

5 Claims, 8 Drawing Sheets

(52) U.S. Cl.
CPC .... *H01L 33/62* (2013.01); *H01L 2224/16221* (2013.01); *H01L 2224/1703* (2013.01); *H01L 2924/12041* (2013.01); *H01L 2924/15159* (2013.01)

(58) Field of Classification Search
CPC ..... H01L 2224/1703; H01L 2224/1403; H01L 24/16; H01L 24/17; H01L 33/00–648; H01L 2933/00–0091; G02F 1/13336; G02F 1/133305; G02F 1/2001; G02F 1/13793; G02F 2001/13793; G02F 2001/133302; G02F 2001/133368; G09G 2300/0473; G09G 2300/0809–0871; G09G 2300/0443–0447; G09G 2300/046; G09G 2300/0478–0495; B32B 2457/202; B32B 2457/206; H05K 2201/10136; G02B 30/20; G02B 2027/0178; G02B 2207/017–0176; H05B 33/0803; F21K 9/00–278; F21Y 2115/00–15
See application file for complete search history.

(56) References Cited

U.S. PATENT DOCUMENTS

| | | | |
|---|---|---|---|
| 2020/0287110 A1* | 9/2020 | Oh | H01L 33/62 |
| 2020/0395348 A1* | 12/2020 | Kwag | H01L 33/50 |
| 2021/0211618 A1* | 7/2021 | Silverstein | H04N 9/3138 |

* cited by examiner

DISPLAY PANEL AND HEAD MOUNTED DEVICE

CROSS REFERENCE TO RELATED APPLICATION

The present application claims priority to Taiwan patent application Serial No. 109120682 filed on Jun. 19, 2020, the entire content of which is incorporated by reference to this application.

BACKGROUND OF THE INVENTION

1. Field of the Invention

The present invention pertains to a display panel and a head mounted device, in particular to a display panel and a head mounted device being able to magnify images.

2. Description of the Prior Art

There are various head mounted devices on the market nowadays, and some head mounted devices can provide theater-level visual effects, allowing people to see large-size images and have a better viewing experience. Besides, some head mounted devices can integrate augmented reality or virtual reality technologies, allowing people to be immersed in the images. In other words, the application of the head mounted devices is quite extensive, the head mounted devices not only can be applied to media entertainment or video games, but also to assist people in their work.

However, in the traditional head mounted device, because the internal display panel needs to be imaged through several lenses, person having ordinary skill in the art can understand that adding an optical module will make the head mounted device heavier. Besides, it also requires high assembly precision for disposing the optical module. In addition, since an object distance from the display panel to the lenses must be fixed, and an optical path from the display panel to the lenses must be kept clear without other components, the volume of the head mounted device will be inevitably large. Moreover, although it is possible to reduce the volume of the head mounted device by designing a more complex optical path, it is also likely to greatly increase the manufacturing and maintenance costs of the head mounted device. Accordingly, the industry needs a new display technology to reduce the volume and weight of the head mounted devices, and to provide a good viewing experience to the consumers at the same time.

SUMMARY OF THE INVENTION

The present invention provides a display panel in which an image is displayed by a plurality of micro light emitting units, and the plurality of micro light emitting units directly project the image to an eye of an observer from a plurality of angles. Since the images are formed on the display panel without lenses, the head mounted device applying the display panel can be smaller and lighter.

The present invention discloses a display panel includes a substrate and a plurality of micro light emitting units. The substrate defines a first position at an edge of the substrate and a second position at a center of the substrate. The plurality of micro light emitting units are arranged and disposed on the substrate. Any two of the plurality of micro light emitting units are disposed at the first position and the second position respectively. Wherein each of the micro light emitting units defines a luminating top surface, and a reference angle is defined between each of the luminating top surfaces and a reference plane respectively. Wherein the reference angle defined between each of the luminating top surfaces and the reference plane gradually decreases from the first position to the second position, and the luminating top surface of the micro light emitting unit located at the second position is parallel to the reference surface.

In some embodiments, the substrate may have a flat surface, the plurality of micro light emitting units are disposed on the flat surface, and the reference plane is a virtual plane perpendicular to a normal direction of the flat surface. Besides, the micro light emitting unit at the first position may be connected to the substrate via two first bumps which are not equal in height. In addition, the micro light emitting unit at the second position may be connected to the substrate via two second bumps which are the same in height.

In some embodiments, the substrate may have a curve surface, and the plurality of micro light emitting units are disposed on the curve surface. Besides, the curve surface may be a symmetrical concave surface, and the first position and the second position are respectively corresponded to an edge and a center of the concave surface of the substrate, the micro light emitting unit at the first position is connected to the substrate via two first bumps, and the micro light emitting unit at the second position is connected to the substrate via two second bumps, and the two first bumps and the two second bumps are the same in height. In addition, the substrate may be a flexible substrate, and the substrate has the concave surface with adjustable curvatures. Moreover, the substrate may define a first display area, in which the micro light emitting units located at the first position and the second position are disposed, and a center of the first display area is aligned with a pupil position of a first eye of an observer.

The present invention provides a head mounted device including a display panel in which an image is displayed by a plurality of micro light emitting units, and the plurality of micro light emitting units directly project the image to an eye of an observer from a plurality of angles. Since the images are formed on the display panel without lenses, the head mounted device applying the display panel can be smaller and lighter.

The present invention discloses a head mounted device includes a first display panel having a first substrate and a plurality of first micro light emitting units. The first substrate defines a first display area, wherein a first position is defined at an edge of the first display area and a second position is defined at a center of the first display area. The plurality of first micro light emitting units, disposed on the first substrate, emit light toward a light emitting side, and project a first image, wherein any two of the plurality of first micro light emitting units are disposed at the first position and the second position respectively. Wherein the light emitted from each of the first micro light emitting units has a first offset angle relative to the light emitting side, the first offset angle of each first micro light emitting unit gradually decreases from the first position to the second position.

In some embodiments, the first image has a first size in the first display area, when the first eye of the observer observes the first image from the light emitting side, the first image visually corresponds to a second size greater than the first size. Besides, a first distance is defined between the substrate and an observing plane, when the first eye of the observer observes the first image on the observing plane from the light emitting side, a visual distance between the first image and the observing plane is defined as a second distance greater than the first distance.

In some embodiments, the head mounted device further includes a second display panel. The second display panel include a second substrate and a plurality of second micro light emitting units. The second substrate defines a second display area, wherein a first position is defined at an edge of the second display area and a second position is defined at a center of the second display area. The plurality of second micro light emitting units, disposed on the second substrate, emit light toward the light emitting side, and project a second image, wherein any two of the plurality of second micro light emitting units are disposed at the first position and the second position respectively. Wherein the light emitted from each of the second micro light emitting units has a second offset angle relative to the light emitting side, the second offset angle of each second micro light emitting unit gradually decreases from the first position to the second position. Wherein the center of the first display area and the center of the second display area are aligned with a first eye and a second eye of an observer respectively, and the center of the first display area is separated from the center of the second display area by a center distance. The center distance is positively related to the distance between the first eye and the second eye. Besides, the first offset angle may be an angle between the light perpendicularly emitted from a luminating top surface of the first micro light emitting unit and the light emitting side.

To summarize, the display panel and the head mounted device provided by the present invention can display images by the plurality of micro light emitting units, and the plurality of micro light emitting units directly project the images to the eyes of the observer from a plurality of angles. Since there is no need to configure the lenses in the head mounted device, the weight and the volume of the head mounted device can be reduced, and the manufacturing and maintenance costs of the head mounted device can also be reduced.

BRIEF DESCRIPTION OF THE APPENDED DRAWINGS

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
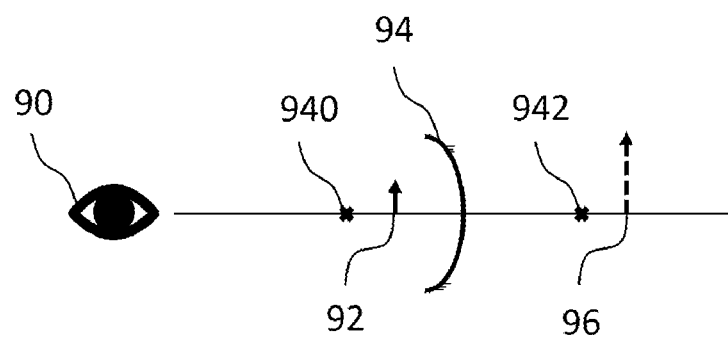
FIG. 1 is a schematic diagram of a traditional optical imaging system.

According to the principle of optical imaging, person having ordinary skill in the art should understand that a concave lens can form an upright magnified virtual image under specific conditions. Please refer to FIG. 1. FIG. 1 is a schematic diagram of a traditional optical imaging system. As shown in FIG. 1, if an object 92 is placed in front of a concave mirror 94 and the distance between the object 92 and the concave mirror 94 is close enough, an observer's eye 90 should be able to see a virtual image 96, upright and magnified, of the object 92 through the concave mirror 94. In detail, assuming that the object 92 is placed within a focus 940 of the concave mirror 94, it can be deduced that the virtual image 96 should be located outside the virtual focus 942 behind the concave mirror 94 (symmetrical to the focus 940 in front of the concave mirror 94) based on the principle of optical imaging. In addition, since the distance between the virtual image 96 and the concave mirror 94 is greater than the distance between the object 92 and the concave mirror 94, it can be deduced that the size of the virtual image 96 is larger than the size of the object 92.

In practice, the distance between the virtual image 96 and the concave mirror 94 can be derived from the distance between the object 92 and the concave mirror 94, and the distance between the focus 940 and the concave mirror 94 in the first place. Then, the magnification ratio of the virtual image 96 can be derived. In other words, as long as the focus 940 of the concave mirror 94 and the position of the object 92 are set, the position and the size of the virtual image 96 can be determined accordingly. For example, assuming that the object 92 is an image, the observer's eye 90 should be able to see the magnified image from the concave mirror 94, and the magnification ratio of the image can be calculated in advance based on the relative positions of the object 92, the focus 940, and the concave mirror 94.

Figure 2:
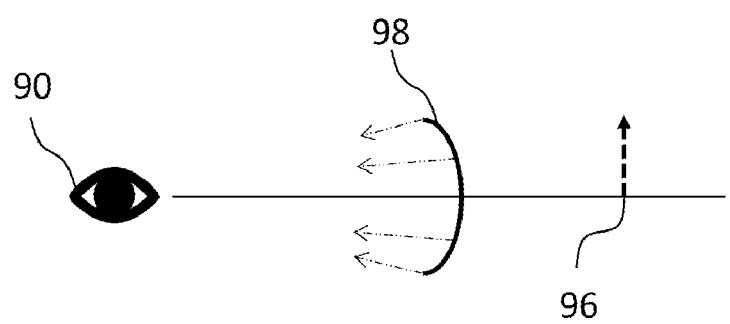
FIG. 2 is a schematic diagram of an optical imaging system in accordance with an embodiment of the present invention.

The present invention improves the optical imaging system of FIG. 1. Please refer to FIG. 1 and FIG. 2 together. FIG. 2 is a schematic diagram of an optical imaging system in accordance with an embodiment of the present invention. In the example of FIG. 2, the concave mirror 94 has been removed in this embodiment, and the display panel 98 is used to simulate the light reflected by the concave mirror 94. The following will explain the image of the display panel 98 and the visual experience of the observer's eye 90.

In an example, the image of the display panel 98 may be pre-recorded or measured using the optical imaging system of FIG. 1, which means the light reflected from each position of the concave mirror 94 that enters the observer's eye 90 can be pre-recorded or measured. Since there is the object 92 in FIG. 1, the light reflected at each position of the concave mirror 94 naturally includes all the necessary information for the observer's eye 90 to see the virtual image 96. In addition, assuming that the concave mirror 94 is a screen, each position of the concave mirror 94 can correspond to a pixel of the screen. The light reflected by each position of the concave mirror 94 can be recorded or measured and can be regarded as the image data of all pixels of the screen. This embodiment does not limit how the light reflected from each position of the concave mirror 94 is recorded. For example, a high-resolution camera or a light sensor can be used to record the reflected and transform the reflected light to the image data.

Then, the image data is transmitted to the display panel 98, so that the pixels in each position of the display panel 98 can display the corresponding image data. Person having ordinary skill in the art should understand that if the light emitted by each pixel in the display panel 98 of FIG. 2 is completely equal to the reflected light from each position of the concave mirror 94, in theory, the observer's eye 90 can see the same magnified virtual image 96 from the display panel 98. As long as the focus 940 of the concave mirror 94 and the position of the object 92 is set according to the optical imaging system of FIG. 1, and the light reflected by each position of the concave mirror 94 is recorded as the image data, the observer's eye 90 can see the virtual image 96 in corresponding size from the display panel 98 of the optical imaging mechanism of FIG. 2.

Figure 3A:
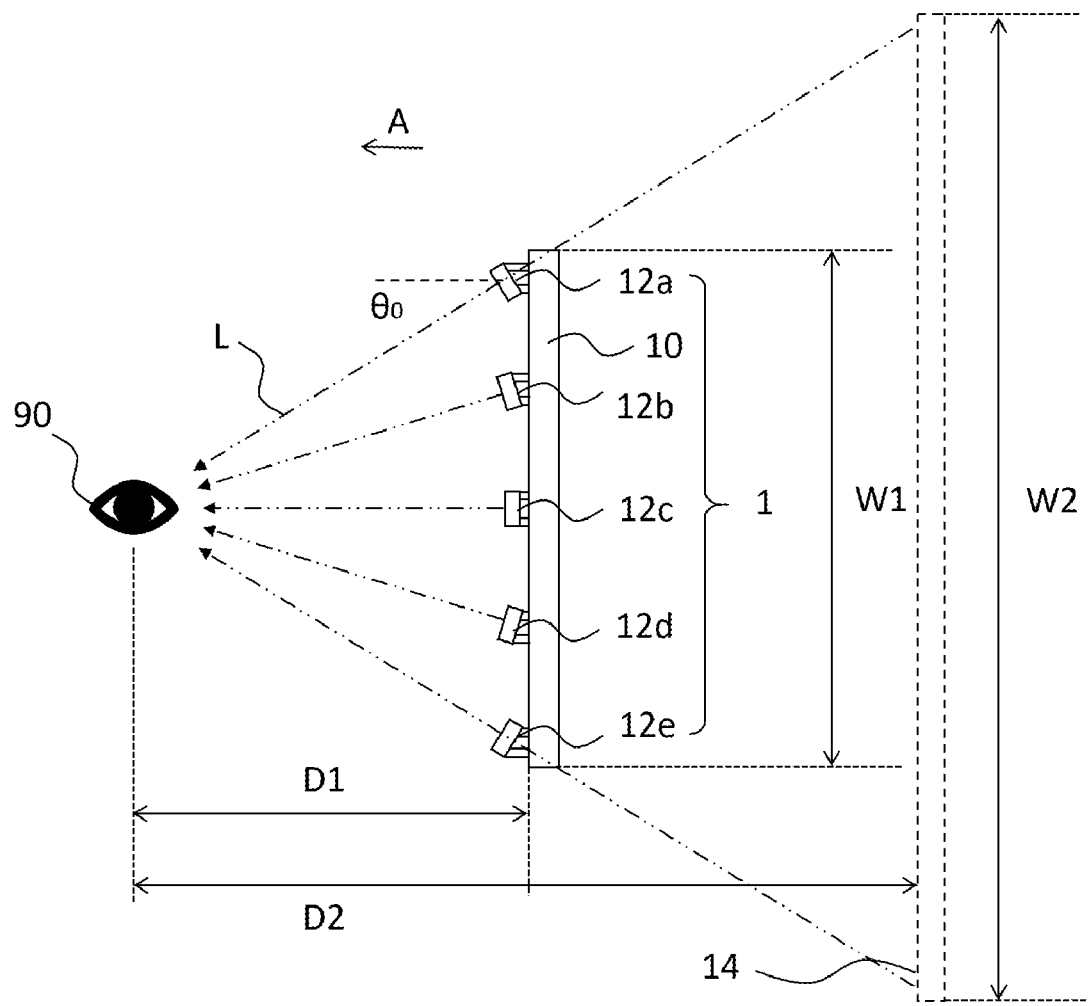
FIG. 3A is a schematic diagram of a display panel in accordance with an embodiment of the present invention.

After explaining the principle of optical imaging, please refer to FIG. 3A. FIG. 3A is a schematic diagram of a display panel in accordance with an embodiment of the present invention. FIG. 3A illustrates the display panel 1 which may be regarded as the display panel 98 of FIG. 2. As shown in FIG. 3A, the display panel 1 includes a substrate 10 and a plurality of micro light emitting units 12a to 12e. The substrate 10 defines a display area. The display area may be an area on the substrate 10, for example, on which the micro light emitting units 12a to 12e are arranged. In this embodiment, the substrate 10 may have a light emitting side A, as showing in FIG. 3 for example, located on the left side of the substrate 10. The position of the light emitting side A should be objective and therefore unrelated to the shape or size of the substrate 10. For example, as the observer's eye 90 watches the display panel 1 from the light emitting side A (the left side of the substrate 10 in FIG. 3), it is not limited whether the observer's eye 90 is aligned with the optical axis passing through the center of the display panel 1. Even if the observer's eye 90 slightly deviates from the optical axis of the display panel 1, the observer's eye 90 should be deemed as on the light emitting side A as long as the observer's eye 90 is still on the left side of the substrate 10.

In addition, a plurality of micro light emitting units 12a to 12e may be disposed on a surface of the substrate 10 facing the light emitting side A, and emit light L toward the light emitting side A. In practice, a plurality of micro light emitting units 12a to 12e can be arranged on the substrate 10 in an array and used to display an image (the first image). In an example, the micro light emitting units 12a to 12e may be self-luminous elements, such as micro light emitting diodes (micro-LEDs), but are not limited herein. Since the display panel 1 emits light by itself, in addition to saying that the observer's eye 90 sees the first image, it can also be understood that the plurality of micro light emitting units 12a to 12e project the first image to the observer's eye 90. In addition, the light L emitted by the plurality of micro light emitting units 12a to 12e of the display panel 1 can be considered as the light reflected by each object in the displayed image.

Taking FIG. 3A as an example, the angles between the light L, emitted by the micro light emitting units 12a to 12e at different positions, and the light emitting side A are different. That is, each micro light emitting unit may have its own first offset angle $\theta_O$ relative to the light emitting side A. Since the substrate 10 shown in FIG. 3 is flat, the angle between the light L emitted by the micro light emitting units 12a to 12e and the light emitting side A (the first offset angle $\theta_O$) is the angle of the light L and the normal of the substrate 10. It means that each of the micro light emitting units 12a to 12e has a different light emitting angle relative to the observer's eye 90. For example, the micro light emitting unit 12a at the edge of the substrate 10 (or the edge of the display area) has a greater light emitting angle $\theta_O$, while the micro light emitting unit 12c at the center of the substrate 10 (or the center of the display area) has a smaller light emitting angle $\theta_O$. In other words, the light emitting angle of each of the micro light emitting units 12a to 12e may be related to its position in the display area.

Figure 3B:
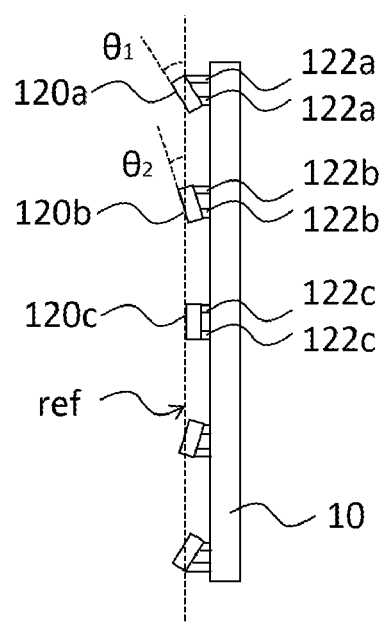
FIG. 3B is a partial magnified schematic diagram of the display panel according to FIG. 3A.

In order to explain how the plurality of micro light emitting units 12a to 12e emit light L at different angles, please refer to FIGS. 3A and 3B together. FIG. 3B is a partial magnified schematic diagram of the display panel according to FIG. 3A. As shown in the figures, taking the micro light emitting unit 12a (the first micro light emitting unit) and the micro light emitting unit 12b (the second micro light emitting unit) as examples, the micro light emitting unit 12a is disposed on the substrate 10 relatively close to the edge (the first position), and the micro light emitting unit 12b is disposed on the substrate 10 relatively close to the center (the second position). Assuming that the center of the substrate 10 (or the center of the display area) is aligned with the observer's eye 90 (for example, the first eye), neither the micro light emitting unit 12a nor the micro light emitting unit 12b is aligned with the optical axis at the center of the substrate 10 (or the center of the display area). Therefore, both the micro light emitting unit 12a and the micro light emitting unit 12b need to redirect the light to the observer's eye 90, so that the light of the display panel 1 can be imaged by the observer's eye 90.

In practice, the micro light emitting units 12a to 12e may be flip-chip micro light emitting diodes. The micro light emitting unit 12a can emit light vertically from the top surface 120a. Person having ordinary skill in the art should understand that the flip-chip structure of the micro light emitting unit 12a has an anode pad and a cathode pad on the opposite surface of the top surface 120a to transmit voltage or current. In an example, the anode pad and the cathode pad are respectively connected to the substrate 10 via two bumps 122a (the first bumps). It can be seen from FIG. 3B that the two bumps 122a of this embodiment are not equal in height. For example, the bump 122a near the edge of the substrate 10 is higher, and the bump 122a near the center of the substrate 10 is lower. In other words, although the substrate 10 of this embodiment is flat, the micro light emitting unit 12a of this embodiment makes the top surface 120a inclined relative to the substrate 10 since the heights of two bumps 122a are unequal. In this embodiment, assuming that a surface parallel to the substrate 10 is a reference surface ref, there is an angle $\theta_1$ (the first angle) between the top surface 120a and the reference surface ref.

Similarly, in the case of the micro light emitting unit 12b, the light can be emitted vertically from the top surface 120b, and the anode pad and the cathode pad of the micro light emitting unit 12b are respectively connected to the substrate 10 via two bumps 122b. It can be seen from FIG. 3B that the two bumps 122b also have different heights. For example, the bump 122b near the edge of the substrate 10 is higher than the bump 122b near the center of the substrate 10. Since the micro light emitting unit 12b is arranged on two bumps 122b with unequal heights, there is also an angle $\theta_2$ (the second angle) between the top surface 120b and the reference surface ref. However, unlike the micro light emitting unit 12a, the micro light emitting unit 12b is closer to the center of the substrate 10 (or the center of the display area) than the micro light emitting unit 12a, so the angle $\theta_2$ is smaller than the angle $\theta_1$, that is, the top surface 120b may not tilt as much as the top surface 120a.

Taking the micro light emitting unit 12c as an example, the light can be emitted vertically from the top surface 120c, and the anode pad and the cathode pad of the micro light emitting unit 12c are connected to the substrate 10 via two bumps 122c respectively. However, since the micro light emitting unit 12c is exactly disposed on the center of the substrate 10 (or the center of the display area), person having ordinary skill in the art should understand that the direction of the light of the micro light emitting unit 12c does not need offsetting. In other words, as long as the top surface 120c is parallel to the reference surface ref, the light emitted perpendicular to the top surface 120c can directly enter the observer's eye 90, namely the angle between the top surface 120c and the reference surface ref is zero. Furthermore, since the top surface 120c does not need to be inclined, unlike the two bumps 122a and the two bumps 122b which are different in heights, it is easily understood that the heights of the two bumps 122c are the same.

Please continue to refer to FIG. 3A, the light emitting angle $\theta_0$ of each of the micro light emitting units 12a to 12e may be related to the focal length of the concave mirror to be replaced or simulated by the display panel 1. Person having ordinary skill in the art can understand that the light emitting angle $\theta_0$ may be affect by many factors, therefore the calculation manner or the range of the light emitting angle $\theta_0$ described herein should not be a restrictive interpretation to the present disclosure. On the other hand, because the display panel 1 is used to simulate the light field information of a displayed object, when the observer's eye 90 look at the display panel 1 from the light emitting side A, the observer's eye 90 should visually see the magnified first image. Taking FIG. 3A as an example, it is assumed that the observer's eye 90 are located on an observing plane, and the observing plane (where the observer's eye 90 located) and the display panel 1 are actually separated by a first distance D1. Because the first image 14 should be seen behind the display panel 1, the distance between the visual first image 14 and the observer's eye 90 is represented here as the second distance D2. It can be seen from FIG. 3A that the second distance D2 is reasonably greater than the first distance D1. In addition, according to the previous description of FIG. 1, person having ordinary skill in the art should understand that, assuming the image in the actual display area (for example, the area where the micro light emitting units 12a to 12e are disposed) is the first size W1, the visual first picture 14 is correspondingly regarded as the second size W2 larger than the first size W1.

In an example, if the difference between the second distance D2 and the first distance D1 is regarded as a preset distance, the preset distance should refer to the image distance. Since this embodiment is used to simulate the optical imaging system of FIG. 1, theoretically the distance (object distance) from the object 92 to the concave mirror 94 should be known. Therefore, the image distance and the object distance can also be used to calculate the focal length of the concave mirror 94. In other words, the focal length of the concave mirror 94 is related to the difference between the second distance D2 and the first distance D1 (preset distance), this means the light emitting angle $\theta_0$ of each micro light emitting unit 12 may also be related to the preset distance.

Figure 4A:
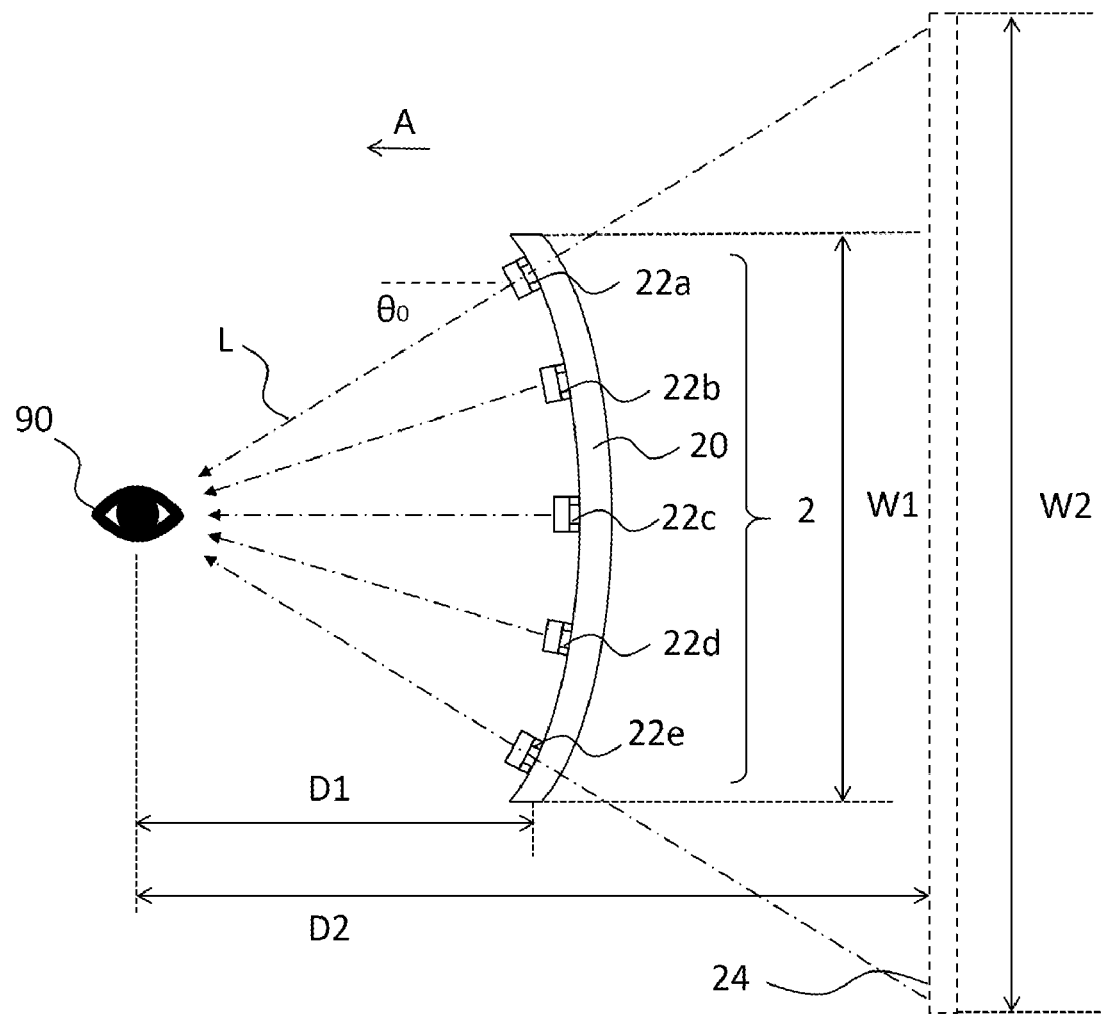
FIG. 4A is a schematic diagram of a display panel in accordance with another embodiment of the present invention.

It should be noted that the shape of the substrate 10 is not limited in the embodiment. Although the substrate 10 shown in FIG. 3A is flat, the substrate 10 may also be a flexible substrate with a curved shape. Please refer to FIG. 3A and FIG. 4A together. FIG. 4A is a schematic diagram of a display panel in accordance with another embodiment of the present invention. The same as the embodiment of FIG. 3, the display panel 2 of FIG. 4A may also include a substrate 20 and a plurality of micro light emitting units 22a to 22e. The observer's eye 90 look into the display panel 2 from the light emitting side A and can also see the first image 24 visually. Because the substrate 20 has a curved surface, the light L emitted by the micro light emitting units 22a to 22e at different positions also have different offset angles $\theta_0$ relative to the light emitting side A. It is easier to understand that because the display panel 2 is also to replace or simulate the concave mirror 94 of FIG. 1, the light emitted from the micro light emitting units 12a~12e or the light emitted from the micro light emitting units 22a-22e should eventually project into the observer's eye 90, the only difference lies in what component provides the first offset angle $\theta_0$.

Person having ordinary skill in the art should understand that since the substrate 10 shown in FIG. 3A is flat, it means that the first offset angle $\theta_0$ should be completely provided by the corresponding micro light emitting units 12a to 12e, so that the light emitting angle of each of the micro light emitting units 12a to 12e is the first offset angle $\theta_0$. Conversely, since the substrate 20 shown in FIG. 4A is curved, the first offset angle $\theta_0$ can be provided by the curvature of the substrate 20 and the micro light emitting units 22a to 22e. For example, the micro light emitting units 22a to 22e may have the same light emitting angle, for example, emitting light from the top surface 220a to 220e vertically. As long as the curvature of the position where each of the micro light emitting units 22a to 22e is set on the substrate 20 corresponds to its own first offset angle $\theta_0$, the light L emitted from each of the micro light emitting units 22a to 22e on the mentioned position will also be the first offset angle $\theta_0$.

Figure 4B:
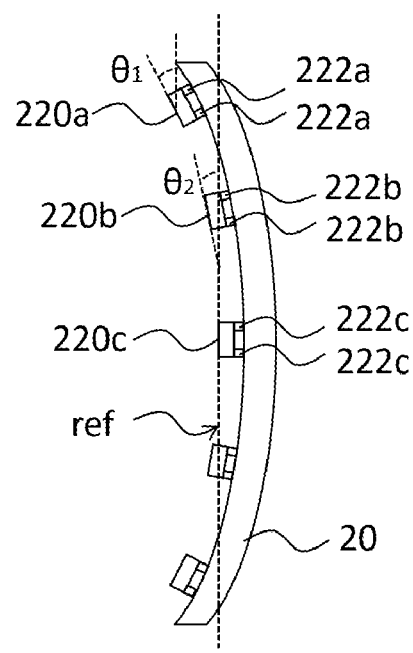
FIG. 4B is a partial magnified schematic diagram of the display panel according to FIG. 4A.

To explain how the micro light emitting units 22a to 22e emit light L with different angles, please refer to FIG. 4A and FIG. 4B together. FIG. 4B is a partial magnified schematic diagram of the display panel according to FIG. 4A. The same as the previous embodiment, the micro light emitting unit 22a and the micro light emitting unit 22b are not on the optical axis aligned with the center of the substrate 20 (or the center of the display area), but as long as the substrate 20 has been set a correct curvature (for example, its first offset angle $\theta_0$), the micro light emitting unit 22a and the micro light emitting unit 22b may not need to be tilted, and the light can still be projected to the observer's eye 90. In an example, because the micro light emitting unit 22a does not need to be inclined, the anode pad and the cathode pad of the micro light emitting unit 22a can be connected to the substrate 20 via two bumps 222a of equal height. For example, as long as the micro light emitting unit 22a is placed at the correct position on the substrate 20, the light L emitted vertically outward from the top surface 220a can be projected to the corresponding focus in the observer's eye 90. Assuming that the optical axis passing through the center of the substrate 20 is aligned with the observer's eye 90, a reference plane ref perpendicular to the optical axis may further be defined in the embodiment. The same as the previous embodiment, there is an angle $\theta_1$ (the first angle) between the top surface 220a of the micro light emitting unit 22a and the reference surface ref, and there is another angle $\theta_2$ (the second angle) between the top surface 220b of the micro light emitting unit 22b and the reference surface ref. Similarly, since the micro light emitting unit 22b is closer to the center of the substrate 20 (or the center of the display area) than the micro light emitting unit 22a, the angle $\theta_2$ will be smaller than the angle $\theta_1$, that is, the top surface 220b is less inclined.

It is worth mentioning that, in the example shown in FIG. 4A, the substrate 20 may be flexible so that the curvature thereof can be varied. Being different from the example shown in FIG. 3A, after the micro light emitting units 12a to 12e are connected to the substrate 10, the light emitting angle (the first offset angle $\theta_0$) of each position in the display panel 1 is fixed. In the example shown in FIG. 4A, the light emitting angle (the first offset angle $\theta_0$) of each position in the display panel 2 will change along with the adjustable curvature of the substrate 20. For example, the curvature of the substrate 20 may be adjusted based on the eyesight of the observer's eye 90. In practice, the curvature of the substrate 20 can be, but not limited to, manually or mechanically adjusted, such as bending the substrate 20.

Figure 5:
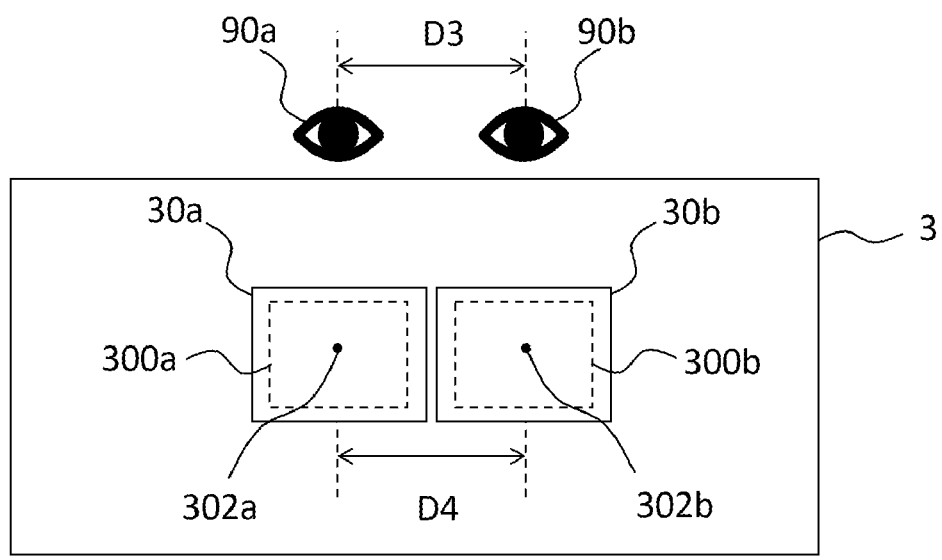
FIG. 5 is a schematic diagram of a head mounted device in accordance with an embodiment of the present invention.

Please refer to FIG. 3A and FIG. 5, FIG. 5 is a schematic diagram of a head mounted device in accordance with an embodiment of the present invention. Taking the display panel 1 of FIG. 3A as an example, the display panel 1 can also be installed in a head mounted device. As shown in the figures, the head mounted device 3 includes a first display panel 30a and a second display panel 30b. The first display panel 30a and the second display panel 30b may be the same, and both of them may be the display panel 1 in the embodiment of FIG. 3A. For example, each of the first display panel 30a and the second display panel 30b has a substrate and micro light emitting units. The structure and the function of the first display panel 30a and the second display panel 30b will not be repeated in this embodiment. In the example of FIG. 5, a first display area 300a may be defined in the first display panel 30a, and the first display area 300a may have a center 302a. Similarly, a second display area 300b may be defined in the second display panel 30b, and the second display area 300b may have a center 302b. It is worth mentioning that the first display area 300a can be a part of the largest display area (area covered by the micro light emitting units) in the first display panel 30a. Namely, the maximum displaying area of the first display panel 30a is larger than the area of the first display area 300a. Similarly, the maximum displaying area of the second display panel 30b is larger than the area of the second display area 300b. Taking the advantage of this, the sizes the first display area 300a and the second display area 300b of this embodiment can be adjusted according to the distance between the observer's eyes.

In one example, the observer may measure and set the distance between his eyes before wearing the head mounted device 3. For example, the distance between the two eyes may refer to a pupil distance D3 between the left eye 90a and the right eye 90b. Certainly, the head mounted device 3 may also be equipped with a camera to measure the distance between the eyes of the observer, but the embodiment is not limited by the means for obtaining the distance between the eyes of the observer thereto. In practice, in order to enable the observer to have a better vision, the center 302a of the first display area 300a can be exactly aligned with the pupil position of the left eye 90a, and the center 302b of the second display area 300b can be exactly aligned with the pupil position of the right eye 90b. That is, the distance D4 (center distance) between the center 302a and the center 302b can be related to the pupil distance D3.

Figure 6:
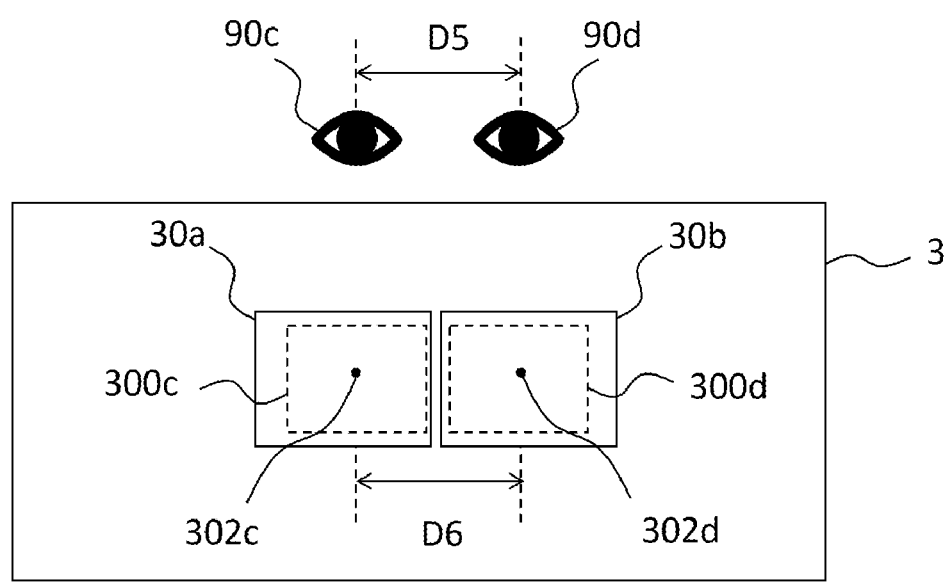
FIG. 6 is a schematic diagram showing the head mounted device of FIG. 5 corresponding to different pupil positions.

In practice, if another observer has a narrower or wider pupil distance, the first display area 300a and the second display area 300b can also be narrowed inwardly or expanded outwardly. Please refer to FIG. 5 and FIG. 6 together. FIG. 6 is a schematic diagram showing the head mounted device of FIG. 5 corresponding to different pupil positions. As shown in the figures, assuming that the pupil distance D5 between the left eye 90c and the right eye 90d of another observer becomes narrower, the first display panel 30a and the second display panel 30b of the head mounted device 3 will reset their display area. For example, a new first display area 300c and a new second display area 300d can be set. Because the positions of the first display area 300c and the second display area 300d are different from the positions of the first display area 300a and the second display area 300b, the first display area 300c and the second display area 300d will have a new center 302c and a new center 302d respectively. Similarly, the distance D6 (center distance) between the new center 302c and the center 302d may be related to the pupil distance D5 between the left eye 90c and the right eye 90d. In other words, the head mounted device 3 demonstrated in this embodiment not only has display panels inside to simulate the concave mirror, but also be able to set display areas suitable for individual observers according to the distance between the eyes of observers to achieve better viewing experience.

Referring to FIG. 4A and FIG. 5, the head mounted device 3 can also be implemented as the display panel 2. The head mounted device 3 in FIG. 5 includes a first display panel 30a and a second display panel 30b, the first display panel 30a and the second display panel 30b may be the same, and both of them may be the display panel 2 in the embodiment of FIG. 4A.

To summarize, the display panel and the head mounted device provided by the present invention can display images by the plurality of micro light emitting units, and the plurality of micro light emitting units directly project the images to the eyes of the observer from a plurality of angles. Since there is no need to configure the lenses in the head mounted device, the weight and the volume of the head mounted device can be reduced, and the manufacturing and maintenance costs of the head mounted device can also be reduced.

What is claimed is:

1. A head mounted device, comprising:
    a first display panel, comprising:
        a first substrate defining a first display area, wherein a first position is defined at an edge of the first display area and a second position is defined at a center of the first display area; and
        a plurality of first micro light emitting units, disposed on the first substrate, emitting light toward a light emitting side, and projecting a first image, wherein any two of the plurality of first micro light emitting units are disposed at the first position and the second position respectively;
    wherein the light emitted from each of the first micro light emitting units has a first offset angle relative to the light emitting side, the first offset angle of each first micro light emitting unit gradually decreases from the first position to the second position.

2. The head mounted device according to claim 1, wherein the first image has a first size in the first display area, when a first eye of an observer observes the first image from the light emitting side, the first image visually corresponds to a second size greater than the first size.

3. The head mounted device according to claim 2, wherein a first distance is defined between the substrate and an observing plane, when the first eye of the observer observes the first image on the observing plane from the light emitting side, a visual distance between the first image and the observing plane is defined as a second distance greater than the first distance.

4. The head mounted device according to claim 1, further comprising:
- a second display panel, comprising:
  - a second substrate defining a second display area, wherein a first position is defined at an edge of the second display area and a second position is defined at a center of the second display area; and
  - a plurality of second micro light emitting units, disposed on the second substrate, emitting light toward the light emitting side, and projecting a second image, wherein any two of the plurality of second micro light emitting units are disposed at the first position and the second position respectively;
  - wherein the light emitted from each of the second micro light emitting units has a second offset angle relative to the light emitting side, the second offset angle of each second micro light emitting unit gradually decreases from the first position to the second position;
  - wherein the center of the first display area and the center of the second display area are aligned with a first eye and a second eye of an observer respectively;
  - wherein the center of the first display area is separated from the center of the second display area by a center distance, and the center distance is positively related to the distance between the first eye and the second eye.

5. The head mounted device according to claim 1, wherein the first offset angle is an angle between the light perpendicularly emitted from a luminating top surface of the first micro light emitting unit and the light emitting side.

\* \* \* \* \*